United States Patent [19]

Clarridge

[11] Patent Number: 4,935,694
[45] Date of Patent: Jun. 19, 1990

[54] PROBE CARD FIXTURE

[75] Inventor: Glenn R. Clarridge, Portland, Oreg.

[73] Assignee: Electro Scientific Industries, Inc., Portland, Oreg.

[21] Appl. No.: 247,088

[22] Filed: Sep. 20, 1988

[51] Int. Cl.⁵ .......................... G01R 1/02; G01R 1/04
[52] U.S. Cl. ............................... 324/158 F; 324/72.5; 324/159 P
[58] Field of Search ......... 324/158 DF, 72.5, 734 PC; 74/573 R, 589, 603, 424.8 R, 571 RM; 33/1 M

[56] References Cited

U.S. PATENT DOCUMENTS

| | | | |
|---|---|---|---|
| 3,787,768 | 1/1974 | Kubota | 324/158 |
| 3,939,414 | 2/1976 | Roch | 324/158 F |
| 3,963,986 | 6/1976 | Morton et al. | 324/158 F |
| 3,996,517 | 12/1976 | Fergason | 324/158 |
| 4,063,172 | 12/1977 | Faure et al. | 324/158 F |
| 4,156,387 | 5/1979 | Portmann | 74/603 |
| 4,357,575 | 11/1982 | Uren | 324/158 |
| 4,406,373 | 9/1983 | Braden | 209/574 |
| 4,471,298 | 9/1984 | Frohlich | 324/158 F |
| 4,510,445 | 4/1985 | Kvaternik | 324/158 F |
| 4,518,914 | 5/1985 | Okubo et al. | 324/158 F |
| 4,527,119 | 7/1985 | Rogers | 324/158 |
| 4,694,245 | 9/1987 | Frommes | 324/158 |

FOREIGN PATENT DOCUMENTS

| | | |
|---|---|---|
| 3136898 | 4/1983 | Fed. Rep. of Germany. |
| 0148063 | 11/1981 | Japan .................... 324/158 P |
| 1228010 | 4/1986 | U.S.S.R. . |

OTHER PUBLICATIONS

"Testing Apparatus with Selectable Probes and Contactors for use with Changeable Patterns", by Faure et al., IBM Tech. Disc. Bull., vol. 20, #9,2/2.78, pp. 3461-3462, cl. 324-158P.

Primary Examiner—Reinhard J. Eisenzopf
Assistant Examiner—W. Burns
Attorney, Agent, or Firm—Stoel Rives Boley Jones & Grey

[57] ABSTRACT

A probe card fixture (20) precisely controls the movement of a probe card (44) relative to a circuit (30) to be tested. The fixture (20) includes a carriage (42) movable to and from the circuit by four lead screws (237) all simultaneously driven by a rigid drive link (300). The probe card (44) is mounted to the carriage (42) by mechanisms that provide for adjustment of the orientation of the probe card (44) to correspond to the orientation of the particular batch of circuits (30) to be tested. A programmable control system (350) controls the lead screw drive to minimize travel of the carriage (42), thereby increasing throughput.

25 Claims, 4 Drawing Sheets

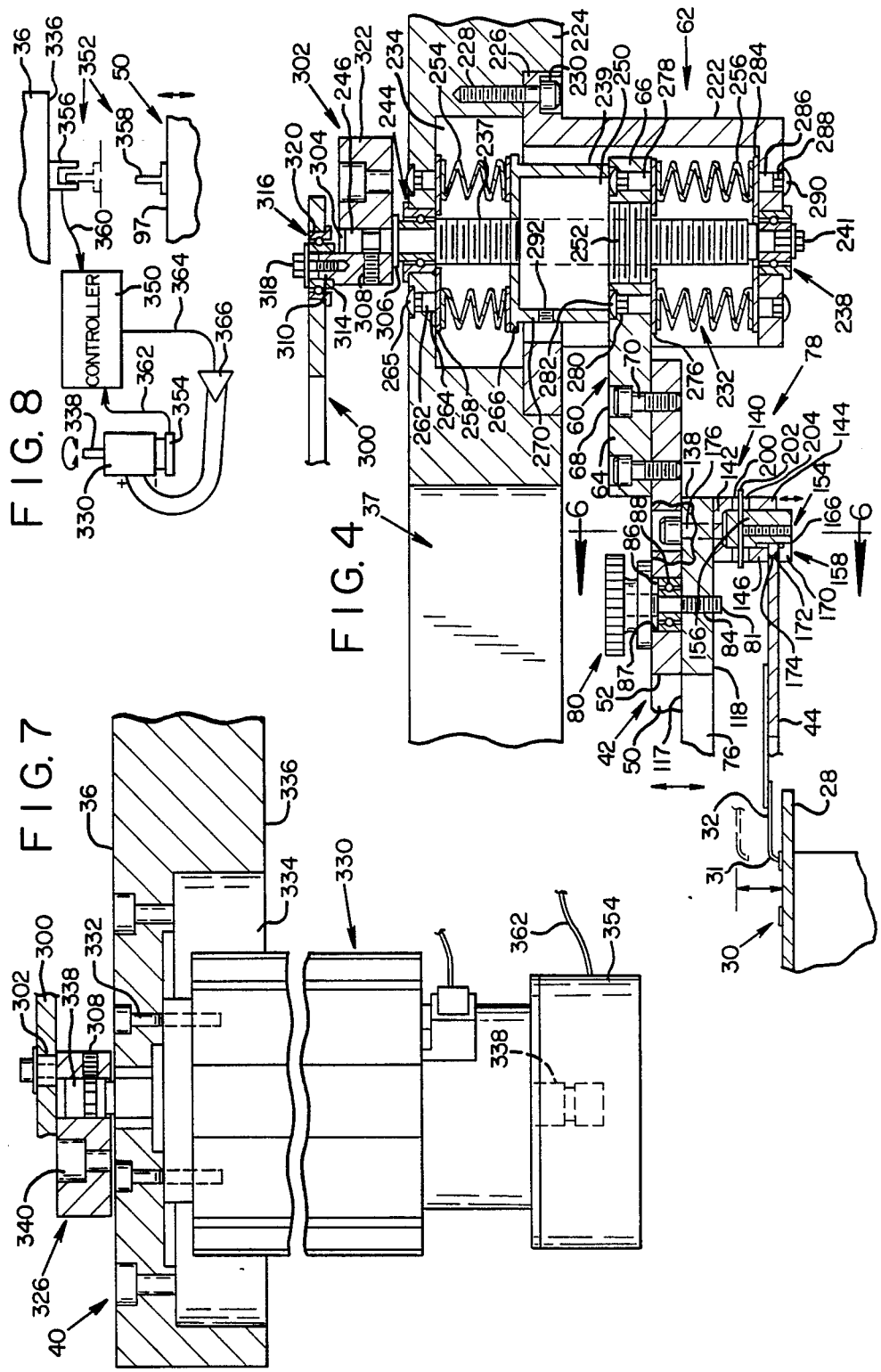

PROBE CARD FIXTURE

TECHNICAL FIELD

This invention pertains to devices for moving test probes into contact with electrical circuits.

BACKGROUND INFORMATION

A common method for testing modern microcircuits involves moving the tips of test probes into contact with selected test locations on the circuit. The probes are connected to test equipment for analyzing the performance of the circuit. During testing, certain circuit components may be altered. For example, with the probes in place on the circuit, laser trimming techniques may be employed to change the configuration of film resistor components of the circuit.

Typically, the probes are mounted to a rigid probe card that has a central opening through which the probe tips protrude. The probe card is carried by a fixture. A circuit is conveyed into the vicinity of the fixture and the fixture moves the probe card toward the circuit until the probe tips contact the circuit test locations. After the circuit is tested, the probe card is moved away from the circuit, and the tested circuit is replaced with another circuit for testing.

The prior art includes various test apparatus that employ mechanized movement of probes to and from a circuit that has been positioned near the test apparatus. These mechanisms, such as described in U.S. Pat. Nos. 3,996,517 (Fergason, et al.) and 3,787,768 (Kubota, et al.), generally achieve the task of moving the probes into contact with the circuit; however, heretofore available mechanisms lack the speed, precision and versatility required for high throughput circuit testing.

SUMMARY OF THE INVENTION

This invention is directed to a fixture for moving a test probe card toward and away from a circuit The fixture operates with greater speed, precision, and versatility than heretofore available mechanisms.

The invention particularly comprises a rigid frame beneath which is positionable a circuit for testing Four lead screws are rotatably mounted to the frame. Each corner of a carriage is connected to a lead screw nut, which nut is threaded over a lead screw. A probe card is mounted to the carriage.

The lead screws are interconnected via a rigid continuous drive link. The drive link is coupled to each lead screw via an eccentric coupling, and to a motor shaft via a similar coupling. As a result, the rotation of the motor shaft is transferred to the lead screws by the reciprocating motion of the drive link. The resulting simultaneous rotation of the lead screws moves the lead nuts downwardly or upwardly along the lead screws, depending upon the rotational direction of the lead screws. Accordingly, the carriage (including the probe card mounted thereto) is moved downwardly toward the circuit or retracted therefrom. When the carriage is moved downwardly toward the circuit, the tips of the probes carried on the probe card will contact the appropriate test locations on the circuit.

The probe card is moved rapidly toward and away from the circuit with substantially no vibration, which vibration decreases throughput because delays or "settling time" must be added to the testing operation while probe tip vibration dissipates.

As another aspect of this invention, the rigid drive link provides positive drive of the lead screws. As a result, very precise carriage position changes are possible.

As another aspect of this invention, the couplings to which the drive link and lead screws are connected include couterweights to dynamically balance the lead screw rotation so that no vibration is generated within the fixture frame as a result of movement in the rigid drive link.

As another aspect of this invention, the carriage is constructed with a carrier plate that is rigidly attached to the lead screw nut, and with a probe card plate, which is movably mounted to the carrier plate. The probe card plate carries the probe card. Consequently, the probe card position can be adjusted so that the probes can be precisely oriented relative to the circuit to be tested. In this regard, means for introducing minute changes in the rotational position of the probe card are provided.

As another aspect of this invention, clamp assemblies are mounted to the probe card plate for securing the probe card to the probe card plate without bending the probe card. Mechanisms are included in the clamp assemblies to ensure that the probe card plate will not be dropped when released therefrom.

As another aspect of this invention, the speed, precision and accuracy of the fixture is fully exploited by a programmable control system. Further, such a system is programmable in consideration of, for example, the height of the particular circuit components to be tested. The fixture is operated programmed to minimize the travel distance of the probes as each tested circuit is replaced with an untested circuit. Such travel-distance control increases throughput.

BRIEF DESCRIPTION OF THE DRAWINGS

FIG. 4 is a sectional view taken along line 4—4 of FIG. 2 showing a lead screw assembly and the mechanisms for mounting the probe card to the fixture.

FIG. 7 is a sectional view taken along line 7—7 in FIG. 2 showing the drive motor mounted to the base plate of the fixture.

FIG. 8 is diagram of the system for controlling movement of the fixture carriage.

DETAILED DESCRIPTION OF PREFERRED EMBODIMENT

Figure 1:
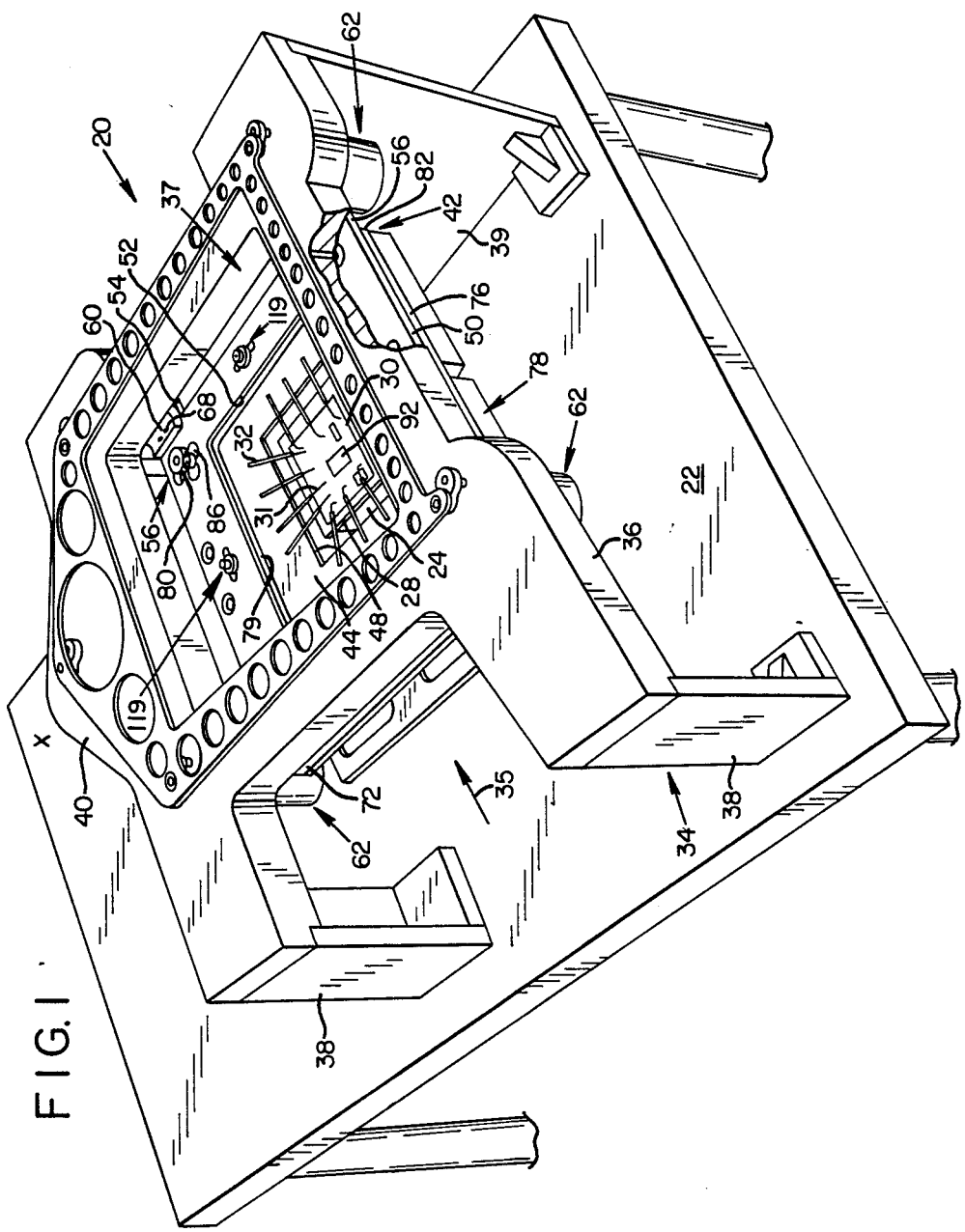
FIG. 1 is a perspective view of a fixture formed in accordance with this invention.
Figure 2:
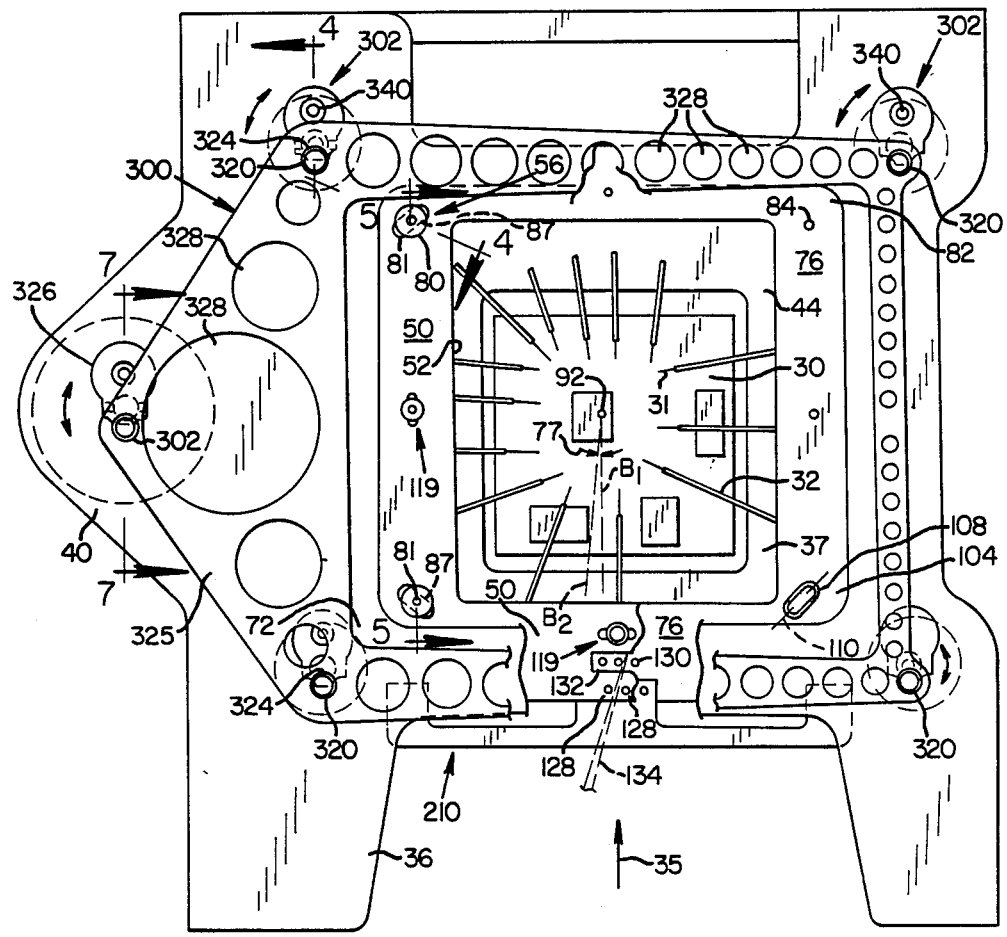
FIG. 2 is a top view of the fixture.

Referring to FIGS. 1 and 2, the probe card fixture 20 of the present invention, which is supported on a work surface 22, is constructed to span a space through which a handler 24 reciprocally moves between a test position and a load/unload position. The top of the handler 24 includes a vacuum chuck for securing a circuit substrate 28 thereto. The components of the circuit 30 to be tested are carried on the upper surface of the substrate 28. Several circuits may be carried on the substrate.

The handler 24 is depicted in the test position wherein the circuit 30 is accessible to the tips 31 of test probes 32. After circuit testing, the handler 24 moves the circuit to the load/unload position (shown as location "X" on the work surface 22), which is away from the probe fixture 20. At the load/unload position, the tested circuit 30 is replaced with an untested circuit, and the handler 24 is then returned to the test position.

Any suitable means for conveying a circuit to and from the test position may be used with the probe card fixture 20 of the present invention. It is preferred to employ a handler 24 such as that available with the Model 4000 Laser Trimming System manufactured by Electro Scientific Industries, Inc. of Beaverton, Oreg.

The probe card fixture 20 includes a rigid metal frame 34 that comprises a horizontally disposed base plate 36 that is supported by two front legs 38 and a rear support wall 39. The base plate 36 is supported above the work surface 22 a distance sufficient to provide clearance for the above-mentioned handler 24 as the handler moves between the load/unload position and the test position. For reference, the front of the fixture 20 is the side indicated by the arrow 35 in the figures.

The base plate 36 includes a central rectangular opening 37. Along one side of the frame 34, the base plate 36 protrudes outwardly from the opening 37 to provide a protrusion 40 to which a drive motor is mounted as described more fully below.

The base plate 36 supports a movable carriage 42 to which is mounted a flat probe card 44. The probes 32 are mounted to the probe card 44. The probe card 44 includes suitable conductor patterns and connectors for delivering signals between the probes 32 and circuit testing equipment (not shown). The probes 32 are mounted to the probe card 44 so that the tips 31 of the probes 32 extend through a cutout 48 in the probe card 44. The carriage 42 is moved downwardly until the probe tips 31 contact the test locations of a circuit 30 that is in the test position.

With reference to FIGS. 1-4, the carriage 42 comprises a carrier plate 50 and a probe card plate 76. The probe card plate 76 is mounted beneath the carrier plate. The carrier plate 50 is generally rectangular in plan and includes a central rectangular opening 52. The carrier plate 50 includes rearwardly projecting tongues 54 at both rear corners 56 thereof. A lead screw bracket 60 is fastened to the top surface of each tongue 54. The lead screw brackets 60 are used for securing the associated rear corner of the carrier plate 50 to lead screw assemblies 62 that are mounted to the underside of the frame base plate 36 near each corner of the opening 37. The lead screw assemblies are described more fully below.

The lead screw brackets 60 are flat and have a rectangular end 64 (as viewed in plan) and an opposing annular end 66. The annular end 66 of the bracket 60 includes a central threaded aperture 67. The rectangular end 64 of each lead screw bracket 60 includes four counterbored holes 68 that are aligned with four threaded holes formed in each tongue 54 of the carrier plate. Threaded fasteners 70 are used to fasten the rectangular end 64 of the lead screw bracket 60 to the top surface of the carrier plate tongue 54 so that the annular end 66 of each lead screw bracket 60 projects outwardly from the side of the carrier plate. The annular end 66 of the bracket 60 engages the lead screw assembly 62.

Each front corner 72 of the carrier plate 50 has a lead screw bracket 60 mounted thereto in a manner as just described with respect to the rear corners 56. That is, the rectangular end 64 of each lead screw bracket 60 is mounted with fasteners so that the annular end 66 projects outwardly from the side of the carrier plate 50 to engage a lead screw assembly 62.

With all four corners of the carrier plate 50 attached via lead screw brackets 60 to lead screw assemblies 62, the lead screw assemblies 62 are driven to move the carrier plate 50 upwardly or downwardly. The particulars of the lead screw assemblies 62 and the associated drive means are described later.

The probe card plate 76 is a rigid rectangular plate having bevelled corners (in plan) and a rectangular central opening 79 formed therein.

The probe card plate 76 is mounted to the underside of the carrier plate 50. Clamp assemblies 78 are carried by the probe card plate 76 for securing the probe card 44 the probe card plate 76.

The probe card plate 76 is adjustably mounted to the carrier plate 50 so that the orientation of the probe card plate 76 (hence, the orientation of the probe card 44 and probes 32) can be adjusted to correspond to the orientation of the test locations on the circuits 30 that are positioned beneath the probe card 44. In this regard, it is known that with modern photolithographic production techniques any given batch of circuits is produced with components having a given orientation relative to, for example, the center of the substrate. That orientation, however, may not precisely match the orientation of a second batch of otherwise identical circuits. Accordingly, the probe card plate 76 of the present invention is adjustably mounted to permit changes in the orientation of the probe card 44 so that the probes 32 precisely contact the test locations of each batch of circuits.

To illustrate the foregoing, and with particular reference to FIG. 2, imaginary line $B_1$ represents a characteristic axis of a given batch of circuits, each circuit of the batch being sequentially delivered by the handler 24 to the test position beneath the fixture carriage 42. Line $B_1$ may be, for example, a line corresponding to the central axis of the masks used for applying the circuit components to the substrate. Accordingly, the positions of all components of that circuit are fixed relative to that axis $B_1$.

Imaginary line $B_2$ represents the characteristic axis of a second batch of circuits that is substantially identical to the first batch (i.e., the positions of the second batch circuit components relative to the line $B_2$ match the position of the first batch components relative to line $B_1$). Because of the variations in the circuit fabrication process, characteristic axis $B_2$ is misaligned relative to the characteristic axis $B_1$ of the first batch of circuits. That is, axis $B_2$ is offset from axis $B_1$ by a slight angle 77 (shown exaggerated for clarity in FIG. 2).

To adjust the orientation of the probes 32 and thereby account for the axis misalignment of the batches, the operator of the fixture slightly rotates the probe card plate 76 (hence, the probe card 44) about its center through angle 77 in the direction from $B_1$ to $B_2$. It can be appreciated that the handler 24 is controlled by known means to position the circuit beneath the probe card plate 76 so that the center of the circuit can be aligned with the axis of rotation of the probe card 44 before the probe card plate orientation adjustment is made.

Figure 5:
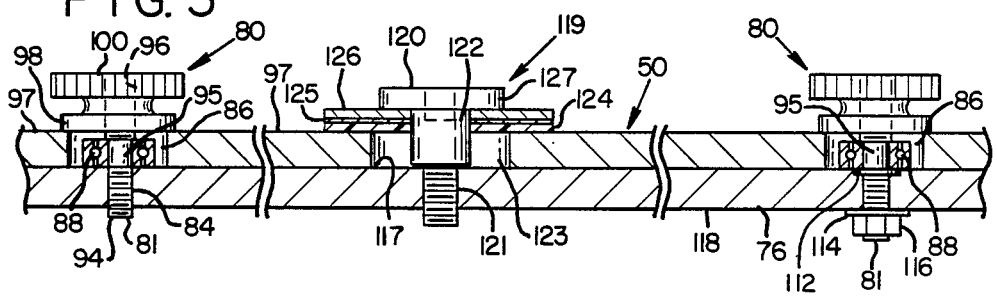
FIG. 5 is a side sectional view taken along line 5—5 of FIG. 2 showing a portion of the carriage that is adapted for adjusting the probe card position.

With particular reference to FIGS. 2, 4 and 5, the mechanisms for adjustably mounting the probe card plate 76 to the carrier plate 50 to permit the rotational adjustment of the former includes thumb nuts 80 and stud bolts 81 that combine to releasably secure the corners of the probe card plate 76 to the corners of the carrier plate 50. Looking first at the rear of the carriage 42, a threaded hole 84 is formed in each rear corner 82 of the probe card plate 76. A bearing guide hole 86 (hereafter referred to as a bearing guide 86) is formed through the carrier plate 50 above the hole 84 in the probe card plate 76. The bearing guide 86 is generally elliptical in plan and receives therewithin a ring bearing 88 that has a diameter that is slightly smaller than the width of the bearing guide 86.

A stud bolt 81, having a threaded lower end 94, a smooth middle section 95 and a threaded upper end 96 extends through the center of the ring bearing 88. The lower end 94 of the stud bolt 81 is permanently threaded into the hole 84 in the probe card plate 76, and the middle section 95 resides within the center of the ring bearing 88. The upper threaded end 96 of the stud bolt 81 has a greater diameter than the center of the ring bearing 88. The bolt 81 is tightened so that the leading thread of the upper end 96 bears upon the inner race of the bearing 88 to fix the bearing position relative to the probe card plate 76. The remaining portion of the upper end 96 of the stud bolt 81 protrudes above the upper surface 97 of the carrier plate 50 to engage the thumb nut 80.

The thumb nut 80 includes a shoulder 98 with an attached knurled knob 100. The shoulder 98 has a diameter greater than the width of the bearing guide 86. Further, the ring bearing 88 is thinner than the carrier plate 50. Accordingly, when the thumb nut 80 is tightened, the shoulder 98 bears upon the upper surface 97 of the carrier plate 50 to tighten the probe card plate 76 against the carrier plate 50.

The bearing guide 86 in the carrier plate 50 is positioned over the hole 84 in the probe card plate 76 such that the bearing 88 will bear upon the innermost edge 87 of the bearing guide 86. Further, the innermost edge 87 of the bearing guide is curved so that the center of the ring bearing 88 may move along a constant radius from the center point 92 of the opening 52 in the carrier plate 50 as the probe card plate 76 is rotated relative to the carrier plate 50. Preferably, the bearing guide 86 is sized to permit the center of the ring bearing 88 to traverse an angle of 4° relative to the center point 92.

Turning now to the front corners 72 of the carrier plate 50 and the corresponding front corners 104 of the probe card plate 76, the thumb nuts 80, stud bolts 81, bearing guides 86 and bearings 88 associated with the front corners 72 of the carrier plate 50 are configured and arranged substantially the same as those described with respect to the rear corners 56 of the carrier plate. The front corners 104 of the probe card plate 76, however, include holes 108 that are unlike those holes 84 in the rear corners 82. Specifically, the front corner holes 108 are specially configured to permit assembly of the carriage 42 with all four bearings 88 firmly bearing upon the innermost surfaces 87 of their associated bearing guides 86 in the carrier plate 50 so that the center point 92 of the carrier plate 50 and the center of the probe card plate 76 remain precisely aligned along an axis normal to the carrier plate despite any rotational position adjustment of the probe card plate 76.

In this regard, the holes 108 in the front of the probe card plate 76 that are beneath the bearing guides 86 in the front corners 72 of the carrier plate 50 are formed with counterbored, generally elongated elliptical shapes. The front holes 108 have straight side edges and a major axis 110 which, in the plane of FIG. 2, passes through the center of the probe card plate 76. A washer 112 fits within the counterbored portion of the hole 108 (FIG. 5). The lower threaded end 94 of a stud bolt 81 extends through the washer 112 to engage another washer 114 and nut 116 on the underside 118 of the probe card plate 76.

To assemble the carriage 42 so that all four bearings 88 firmly bear upon the innermost edges 87 of their associated bearing guides 86, the probe card plate 76 is positioned beneath the carrier plate with the bearings 88 in the rear corners 56 secured, via stud bolts 81, to the probe card plate 76. All thumb nuts 80 are loosely threaded. The rear corners 82 of the probe card plate 76 are forced toward the center 92 of the carrier plate 50 until the bearings 88 in the bearing guides 86 in the carrier plate rear corners 56 firmly bear upon the associated innermost edges 87 of those guides 86. With those bearings 88 against the edges 87 as just described, the stud bolts 81, bearings 88, and (loosened) thumb nuts 80 at the front corners 72 of the carrier plate 50 are slid along the axes 10 of the front holes 108 in the probe card plate 76 until the front bearings 88 firmly bear upon the innermost edges 87 of those bearing guides 86. The nut 116 is then tightened to fix the stud bolt 81 within the front hole 108.

In view of the above-described structure, it can be appreciated that whenever the four thumb nuts 80 are loosened, the probe carrier plate 76 may be slightly rotated relative to the carrier plate 50 while the carrier plate center point 92 and probe card plate center remain axially aligned.

Preferably, mechanisms are employed to ensure that the probe card plate 76 does not fall from the carrier plate 50 in the event that all thumb nuts 80 are inadvertently removed from the stud bolts 81. These securing mechanisms comprise four shoulder screw assemblies 119. A shoulder screw assembly 119 is located along each side of the rectangular opening 52 in the carrier plate at the midpoint thereof.

The shoulder screw assembly 119 includes a shoulder screw 120, the threaded end of which engages a threaded hole 121 in the probe card plate 76. The shoulder of the screw 120 bears upon the top surface 117 of the probe card plate 76. The midportion 122 of the shoulder screw 120 resides within a clearance slot 123 that is shaped to permit the shoulder screw 120 to move with the probe card plate 76 as the probe card plate 76 is rotated relative to the carrier plate 50.

The shoulder screw 120 extends above the upper surface 97 of the carrier plate 50 and is surrounded by a washer 124 that is formed of low-friction material such as manufactured under the trademark Teflon. The low-friction washer 124 extends across the slot 123 to rest upon the upper surface 97 of the carrier plate 50. A metal washer 125 overlays the low-friction washer 124 and is covered with a spring washer 126. The inner edge of the spring washer 126 fits under the flanged upper end 127 of the shoulder screw 120. The shoulder screw 120 is sized so that when it is tightened against the probe card plate 76, the spring washer 126 flexes to urge the low-friction washer 124 against the upper surface 97 of the carrier plate 50 while permitting the washer to slide along that surface whenever the probe card plate 76 is moved relative to the carrier plate 50.

The amount of rotation needed to adjust the position of the probe card plate 76 relative to the carrier plate is typically very small. Accordingly, there is provided in the present invention a mechanism for minute adjustment of the rotational position of the probe card plate 76. Specifically, a pair of pins 128 are press fit into the carrier plate 50 to extend upwardly from the upper surface 97 thereof. A trio of similar pins 130 are press fit into probe card plate 76 to extend upwardly through a cutout 132 in the carrier plate near the pair of pins 128 on the carrier plate 50. The pins 130 on the probe card plate 76 are located between the pair of pins 128 on the carrier plate 50 and the center point 92 of the carrier plate.

To move the probe card plate 76 relative to the carrier plate 50, a lever 134 is extended between the pair of pins 128 to bear upon one of the trio of pins 130. Pins 128 act as a fulcrum and, with all four thumb nuts 80 loosened, the lever 134 is swung to rotatably slide the probe card plate 76 about the center point 92. The carrier plate pins 128 and the probe card plate pins 130 are closely spaced relative to the distance between those pins and the center point 92 of the carrier plate. Consequently, the lever 134 can be controlled by hand to rotate the probe card plate 76 in angular increments that are extremely small. After the rotational position of the probe card plate 76 is adjusted, all of the thumb nuts 80 are tightened and the probe card 44 orientation is fixed for use with a batch of circuits.

Figure 6:
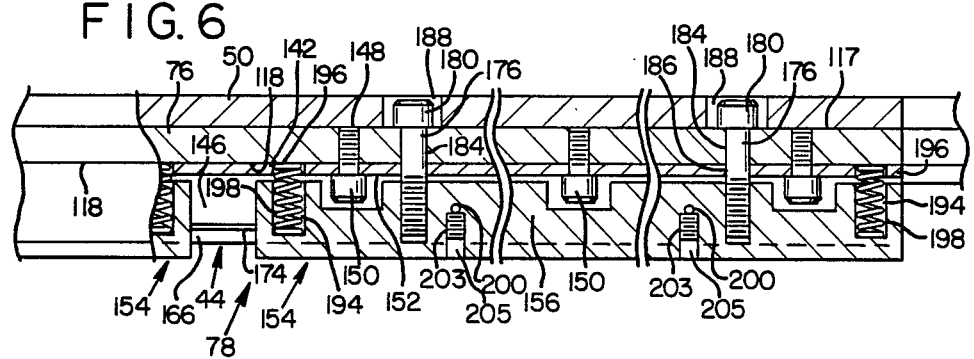
FIG. 6 is a sectional view taken along line 6—6 of FIG. 4 showing a clamp assembly used for securing the probe card to the carriage of the fixture.
Figure 3:
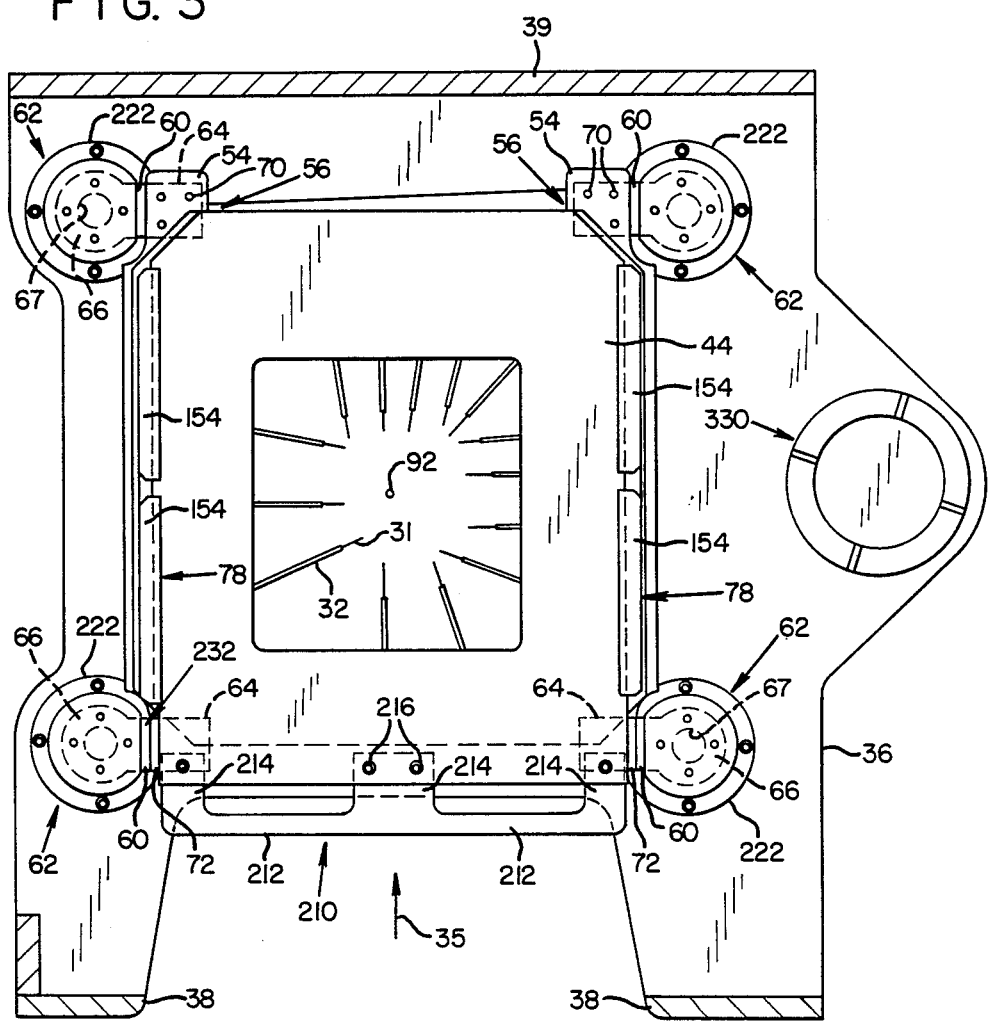
FIG. 3 is a bottom view of the fixture.

The means by which the probe card 44 is clamped to the underside 118 of the probe card plate 76 are now described with particular reference to FIGS. 3, 4 and 6. The clamp assemblies 78 are attached to the underside 118 of the probe card plate 76. One assembly 78 extends along one side of the probe card plate 76 from the front to the back, and the other assembly 78 extends along the other side of the probe card plate 76. The probe card 44 is clamped to reside in the space between the clamp assemblies 78. The description of the clamp assemblies 78 will be directed to one clamp assembly with the understanding that the other assembly is identical.

The clamp assembly 78 includes an elongated fixed clamp member 140 extending between the bevelled front and rear corners of the probe card plate 76. The fixed clamp member 140 is generally U-shaped in cross-section having a base 142 that is fastened to the probe card plate 76, a downwardly extending outer leg 144 located adjacent to the side edge 138 of the probe card plate 76, and a downwardly extending inner leg 146 that is spaced inwardly (i.e., toward the center of the probe card plate 76) from the outer leg 144.

The base 142 of the fixed clamp member 140 is fastened to the probe card plate 76 by six apart-spaced fasteners 148 that pass through holes in the base 142 and are threaded into threaded holes in the probe card plate 76. The heads 150 of the fasteners 148 bear upon the lower surface 152 of the base 142.

A pair of identical elongated movable clamp members 154 are mounted within the fixed clamp member 140. Each movable clamp member 154 has a body 156 and an inwardly protruding lower foot 158. The body 156 is shaped in cross-section to slide upwardly and downwardly within the fixed clamp member 140 between the inner leg 146 and the outer leg 144 thereof. The top surface 160 of the body 156 has six recesses 162 formed therein to provide clearance for the heads 150 of the fasteners 148 whenever the movable clamp member 154 is drawn upwardly into the fixed clamp member.

The side of the movable clamp member body 156 that faces the probe card 44 includes a recess 164 extending the length of the movable clamp member 154. The recess 164 provides space for receiving the edge 166 of the probe card 44 that is clamped by the assembly 78 as described below.

The foot 158 of the movable clamp member 154 protrudes inwardly from the lower inner corner of the body 156. The outermost end of the foot 158 forms a toe 170 that is relatively thicker (as measured along a vertical line in FIG. 4) than the remainder of the foot 158. The toe 170 includes an upper clamp surface 172. The clamp surface 172 is beneath a horizontal bearing surface 174 formed in the end of the inner leg 146 of the fixed clamp member 140. The clamp surface 172 and the bearing surface 174 are drawn together to clamp therebetween the edge 166 of the probe card 44.

The means for clamping the probe card 44 include a pair of fasteners, such as bolts 176 that are threaded into apertures formed in the body 156 of the movable clamp member 154 near each end thereof. The heads 180 of the fasteners 176 bear upon the top surface 117 of the probe card plate 76 and the shafts pass respectively through concentric holes 184, 186 in the probe card plate and in the base 142 of the fixed clamp member 140. Access to the heads 180 of the bolts 176 is provided by access holes 188 formed in the carrier plate 50. It is noteworthy that the access holes 188 in the carrier plate 50 are sized to permit unobstructed lateral movement of the bolt heads 180 whenever the probe card plate 76 orientation is adjusted relative to that of the carrier plate 50 as described above.

To clamp the probe card 44 to the probe card plate 76, the edges 166 of the probe card 44 are first slid into the space between the bearing surfaces 174 and the clamp surfaces 172 of the opposing clamp assemblies 78. The fasteners 176 are rotated to draw upwardly the movable clamp member 154 toward the fixed clamp member 140 until the edge 166 of the probe card 44 is securely clamped between the bearing surfaces 174 and the clamp surfaces 172.

The clamp surface 172 of each toe 170 and the bearing surface 174 of each fixed clamp member 140 are configured and arranged to avoid bending the probe card 44 when it is clamped therebetween. With reference to FIG. 4, it can be seen that when the fasteners 176 are tightened, the clamping force is supplied to the probe card 44 along the clamp surface 172 of the movable clamp member 154. The reaction force is generated in the bearing surface 174 of the fixed clamp member 140. It can be appreciated that if the resultant of the force delivered by the clamp surface 172 is centered outside (i.e.. to the left or right in FIG. 4) of the bearing surface 174, there would be generated at the probe card edge 166 a bending moment, which would cause the probe card to bow. Such bending moment would occur if, for example, (1) the clamping surface 172 was wider than the bearing surface 174, and (2) the clamp assembly 78 was not precisely machined to ensure that the clamp surface 172 and the bearing surface 174 remain in parallel planes.

According to the present invention, the clamp surface 172 of the toe 170 is relatively narrower than the bearing surface 174. As a result, whenever the movable clamp member 154 is drawn upwardly to clamp the edge 166 of a probe card 44, the resultant of the clamping force delivered by the clamp surface 172 will always pass through the bearing surface 177, and the clamp assembly 78 need not be precisely machined to maintain the clamp surface 172 and bearing surface 174 in parallel planes.

The clamp assembly 78 is provided with springs to ensure that the movable clamp member 154 will move apart from the fixed clamp member 140 whenever the fasteners 176 are loosened. Specifically, cylindrical chambers 194 are formed near the ends of each movable clamp member 154. An axially aligned extension portion 196 of each chamber 194 is formed through the base 142 of the fixed clamp member 140. Compression springs 198 are housed within the cylindrical chamber 194 to urge the fixed and movable clamp members apart.

Costly damage to a probe card 44 would result should the movable clamp member 154 fall from the fixed clamp member 140 in the event the fasteners 176 are inadvertently withdrawn from the movable clamp member 154. The present invention provides mechanisms for ensuring that withdrawal of the fasteners 176 will not result in the movable clamp member 154 and probe card 44 falling from the fixed clamp member 140. Specifically, two apart-spaced catch pins 200 extend through holes in the body 156 of the movable clamp member 154. The pins 200 are held in the body 156 by set screws 203 that are threaded into holes 205 tapped through the bottom of the movable clamp member 154. Protruding ends 202 of the clamp pins 200 reside in apertures 204 formed in the inner leg 146 and outer leg 144 of the fixed clamp member 140. The apertures 204 are sized to permit the movable clamp member 154 to travel freely within the fixed clamp member 140 to clamp and release the probe card 44; however, the pin ends 202 will catch on the lower edges of the apertures 204 after the movable clamp member has moved a preselected distance downwardly from the fixed clamp member as the fasteners 176 are withdrawn.

To facilitate the placement of the probe cards 44 within the clamp assembly 78, the present invention provides a probe card handle 210 (see FIG. 3). The handle 210 is a substantially flat member comprising grips 212 and integrally formed mounting brackets 214 extending from the center and both sides thereof. The handle 210 is mounted by fasteners 216 to the top surface of the front of the probe card 44. The mounting brackets 214 on the sides of the handle 210 are configured to abut the front of the inner leg 146 of the fixed clamp member whenever the probe card 44 is slid into precise position relative to the probe card plate 76. After the probe card 44 is slid into position, the card is clamped as described above.

Turning now to the particulars of the means with which the above-mentioned lead screw assemblies 62 are mounted to the fixture 20, particular reference is made to FIG. 4, which shows a typical lead screw assembly 62. As noted, there are four lead screw assemblies 62, one located near each corner of the carriage 42. It is contemplated, however, that a single lead screw assembly 62 may be employed with the carriage 42 movement being stabilized against vibration with suitable sliding guides.

A typical lead screw assembly 62 includes a hollow cylindrical housing 222 that is fastened to the underside 224 of the frame base plate 36. The housing 222 has a flange 226 that extends radially outwardly from the open upper end of the housing 222. The flange 226 seats within a correspondingly shaped recess formed in the underside 224 of the base plate 36. Four apart-spaced fasteners 228 extend upwardly through counterbored apertures 230 in the flange 226 and are threaded into the base plate 36 to secure the housing 222 thereto.

The portion of the housing wall nearest the lead screw bracket 60 has a window 32 formed therein through which the lead screw bracket 60 extends. The window 232 is sized to permit the bracket to move upwardly and downwardly within the housing 222 for the maximum distance traveled by the carriage 42 during operation of the fixture 20.

A cylindrical bellows chamber 234 is formed in the underside 224 of the base plate 36 immediately above the housing 222. The bellows chamber 234 is slightly larger in diameter than the interior of the housing 222.

The lead screw assembly 62 also includes a lead screw 237 and lead nut 239. The lower end of the lead screw 237 is rotatably mounted, via a single-flanged bearing 238, to the bottom of the housing 222. The lower end of the lead screw 237 is permanently secured to the inner race of the bearing 238 by a fastener and washer assembly 241. The upper end of the lead screw 237 is rotatably mounted, via another single-flanged bearing 244, to the portion of the base plate 36 that is immediately above the center of the bellows chamber 234. The upper end of the lead screw 237 includes an unthreaded stem 246 that projects upwardly from the top surface of base plate 36 for connection with a drive mechanism as hereafter described.

Between the bearings 238, 244, the lead screw 237 is threaded through the lead nut 239. The lead nut 239 has an upper section 250 and a contiguous lower section 252. The exterior of the lower section 252 is threaded into the threaded aperture 67 in the annular end 66 of the lead screw bracket 60. The upper section 250 of the lead nut 239 has an outside diameter greater than the outside diameter of the lower section 252. The lead nut 239 is threaded into the lead screw bracket 60 so that the upper section 250 is secured against the top surface of the lead screw bracket 60.

It is preferred to protect the threads of the lead screws 237 from dust or other foreign matter. Accordingly, the exposed threads of the lead screws 237 are enclosed in flexible bellows 254, 256. More particularly, a substantially flat annular bellows cap 258 is mounted to the top surface 260 of the bellows chamber 234. The upper end 242 of the lead screw 237 extends through the center of the cap 258. Attached to the bellows cap 258 are four apart-spaced pim nuts 262 that fit into holes 264 formed in the base plate 36 above the bellows chamber 234. Each pim nut 262 includes a threaded internal bore that receives the shaft of a round-headed screw 265 residing in the upper, counterbored portion of the hole 264 in which the pim nut 262 fits.

A second flat annular bellows cap 266 is secured to the top of the lead nut 239. The second bellows cap 266 includes an attached cylindrical sleeve 270 that fits over and completely covers the upper section 250 of the lead nut 239 and is held thereto by a set screw 272 that is threaded through the wall of the sleeve 270.

The outer ends of the flexible bellows 254 are bonded to the bellows caps 258, 266. The bellows 254 expands and retracts with movement of the lead nut 239 along the length of the lead screw 237.

A third bellows cap 276, which is substantially identical to the first-mentioned bellows cap 258 is attached to the underside of the lead screw bracket 60. Four apart-spaced pim nuts 278 fit within holes 280 formed in the annular part 66 of the lead screw bracket 60 and are held therein by round-headed screws 282 carried in the upper, counterbored portion of those holes 280.

A fourth bellows cap 284, which is substantially identical to the first and third bellows caps 258, 276 described earlier, is secured to the bottom 240 of the housing 222 with the four apart-spaced pim nuts 286 fitting into holes 288 formed therein. The pim nuts 286 receive the threaded ends of round-headed screws 290 that pass through the bottom portion of the holes 288.

The outer ends of the bellows 256 are bonded to the third and fourth bellows caps 276, 284 so that the bellows 256 expands and retracts with movement of the lead nut 239 along the length of the lead screw 237.

Turning now to the mechanism for driving the lead screws 237, the upwardly extending stem 246 of each lead screw 237 is rotatably driven by a rigid drive link 300 that is connected thereto by an eccentric coupling 302. The coupling 302 includes a bore 304 for receiving the stem 246 of the lead screw 237. A washer 306 is positioned between the coupling 302 and the inner race of the flanged bearing 244 at the upper end of the lead screw 237. The coupling 302 is fastened to the stem by three apart-spaced set screws 308 that are threaded through the coupling 302 to engage the stem 246. Preferably, the lead screw 237 is preloaded between the bearings 238, 244 as the set screws 308 are tightened, so that the lead screw 237 will not shift in the axial direction.

Each coupling 302 includes a substantially cylindrical post 310 integrally formed therewith to protrude from the upper surface of the coupling 302. The post 310 is formed with a peripheral rim 314 at its base, upon which rests a single-flanged bearing 316 (flange down). The inner race of the bearing 316 is secured around the coupling post 310 by a threaded fastener and washer combination 318. The outer race of the bearing 316 is press fit within an aperture 320 in the rigid drive link 300 and is bonded thereto.

Each coupling 302 includes an integrally formed counterweight 322 that protrudes outwardly from the rotational axis 324 of the lead screw stem 246. The significance of the counterweight 322 is described more fully below.

With reference to FIG. 2, the drive link 300 is a flat rigid continuous frame-like member that extends around the rectangular opening 37 in the base plate 36 and includes the above-mentioned circular apertures 320 in each corner for mounting the drive link 300 to the couplings 302 of all four lead screw assemblies 62. Further, the drive link 300, includes a generally triangular protruding portion 325 that extends over the center of the protrusion 40 in the base plate 36 to provide for connection between the drive link 300 and a drive motor coupling 326 that is mounted to the shaft 338 of a drive motor 330 that is described below.

It is contemplated that the shape of the drive link 300 may take several forms other than that illustrated. The drive link 300 should be, however, rigid and lightweight. To this end, a plurality of holes 328 are formed in the link 300 to minimize the weight of the link 300 without substantially reducing the rigidity of the link in the direction in which the driving forces are delivered to the link, that direction being generally in the plane of FIG. 2.

With reference to FIG. 7, the drive motor 330 is mounted via four fasteners 332 within a cavity 334 in the underside 336 of the protrusion 40 in the base plate 36. Preferably, the drive motor 330 is a low-inertia motor, type J03, manufactured by Yaskawa Electric America, Inc. of Los Angeles, Calif. Other motors could be used and, as shown in FIG. 7, the motor mounting cavity 334 can be sized to accommodate more than one model of motor.

The portion of the drive motor shaft 338 that protrudes above the base plate 36 is joined to the drive link by the drive motor coupling 326. The drive motor coupling 326 and the means for securing the drive link 320 thereto are substantially the same as those couplings 302 described earlier and, therefore, coupling 326 is illustrated, where appropriate, with reference numerals matching those of the above-described couplings 302. Whenever the motor 330 is driven to rotate the drive shaft 338, the motor driving force is transmitted by the attached eccentric coupling 326 to the drive link 300 and, through the reciprocating motion of the drive link, to the couplings 302 at each lead screw stem 246. Accordingly, the rotation of the drive shaft 338 is transferred to rotation of all the lead screws 237. Depending upon the rotational direction of the lead screws 237, the lead nuts 239 will ride upwardly or downwardly on their associated lead screws carrying the carriage 42 to which they are connected as described above.

It can be appreciated that the portion of the drive link 300 near each lead screw stem 246 is not balanced about the rotational axis 324 of the associated lead stem 246. To eliminate vibration that might otherwise occur with such an unbalanced system, the above-mentioned counterweights 322 are employed. More particularly, the counterweight 322 of each coupling 302, 326 is configured and arranged so that its mass balances the mass of the adjacent portion of the drive link 300 about the axis of rotation 324 of the stem 246. It can be appreciated that any number of counterweight shapes may be employed. It is preferred, however, to employ the circular shape (in plan) illustrated. Further, the coupling is originally formed with a counterweight mass that is greater than required, and the mass is reduced to that required by drilling precisely sized holes 340 therein.

The above described mechanisms for securing and moving a probe card combine to provide a fixture 20 that is operable for very rapid carriage 42 position changes while generating essentially no vibration. Accordingly, throughput (i.e., the number of circuits tested per a unit of time) is increased because the substantially vibration-free carriage movement eliminates the need for delaying test measurements of each circuit while probe vibration dissipates. Such a delay, called "settling time" greatly decreases throughput.

Because the above-described carriage drive mechanisms (drive motor 330, drive link 300, lead screw assemblies 62, etc.) are capable of producing very accurate, rapid, and minute incremental position changes, those drive mechanisms are preferably controlled by an automated control system that fully exploits the speed and accuracy of the fixture.

Specifically, with reference to FIG. 8, the control system comprises a programmable controller 350 that has suitable interface devices for receiving position data generated from two sources: a limit switch 352 and an encoder 354. The limit switch 352 can be any suitable switch for producing a signal representative of a home position, wherein the home position is the position the carriage 46 (hence, the probe card 44) assumes whenever the lead screw assemblies 62 are driven to fully retract the carriage 46 away from a circuit (for example, upon completion of the testing operation). Preferably, the limit switch 352 comprises an optical sensor 356 and a flat index member 358.

The sensor 356, such as OPB 82157 (model) manufactured by TRX of Carrollton, Tex., is mounted to the underside 336 of the fixture base plate 36. The sensor 356 is configured to receive the upwardly protruding index member 358, that member 358 being mounted to the upper surface 97 of the carrier plate 50. The index member 358 is detected by the sensor 356 whenever the carriage 46 is retracted. The presence of the index member 356 within the sensor 354 is instantaneously provided to the controller 350 via a conductor 360.

As noted, other position data are generated by a conventional encoder 354 mounted to the bottom of the drive motor 330 and driven by the motor shaft 338. One suitable encoder is a RENCO, Model R-802. The output of the encoder 354 correlates to the motor shaft 338 position (hence, to the position of the carriage 42) and is provided to the controller 350 via conductor 362.

The controller 354 is programmed to control the carriage movement in accordance with the configuration of the circuit(s) 30 carried by the substrate that is in the test position beneath the probers 32. In this regard, the controller 350 generates a positive or negative output voltage signal (the polarity of the voltage signal being dependent upon the direction in which the motor 330 is to be driven) that is applied via conductor 364 to a power amplifier 366, the output of which drives the motor 330.

Preferably, the program that drives the controller 350 is supplied by a host computer, which host computer has stored in memory a plurality of programs corresponding to various circuit configurations. In this regard, it can be appreciated that for any given circuit 30, the distance that the probes 32 must be retracted after testing to avoid damage as a tested circuit is replaced with another will depend upon the maximum height of the circuit components carried by the substrate. Accordingly, for each batch of circuits operated upon by the fixture of the present invention, a control program can be devised to minimize the amount of carriage travel required to that necessary for the probes to avoid damaging contact with the circuit components as the tested circuit is replaced with an untested circuit. Minimizing travel of the carriage increases throughput of the tested circuits.

While a preferred embodiment of the present invention has been described and illustrated, various modifications will be apparent to those skilled in the art. The invention is intended to include all such modifications within the scope of the appended claims.

I claim:

1. A probe card fixture for moving a probe card toward and away from a circuit, comprising:
   a frame;
   a carriage adapted to hold a probe card;
   a lead screw mounted to the frame and connected to the carriage so that rotation of the lead screw in one of two opposing rotational senses moves the carriage in a corresponding one of two opposing directions; and
   drive means operatively coupled by a substantially rigid drive link to the lead screw for selective rotation of the lead screw in one of the opposing rotational senses to impart linear uniaxial motion to the carriage in the corresponding one of the two opposing directions.

2. The fixture of claim 1 wherein two or more lead screws are mounted to the frame and connected to the carriage for moving it, and wherein the drive means includes a motor that is operatively coupled to the lead screws by the drive link for rotating the lead screws.

3. The fixture of claim 2 further including couplings for connecting each lead screw to the drive link, the couplings having a counterweight portion configured and arranged to balance the rotational forces applied to the lead screws.

4. The fixture of claim 3 wherein each coupling includes a post member, the drive link being rotatably mounted to the post member about an axis eccentric to the rotational axis of the lead screw.

5. The fixture of claim 1 further including programmable control means connected to the drive means for controlling the amount and rotational sense of the lead screw, wherein the amount and sense of lead screw rotation is correlated to the configuration of the circuit components.

6. The fixture of claim 1 wherein the drive means includes a motor and a rigid drive link, the drive link interconnecting the lead screw and the motor for delivering rotational motion of the motor to the lead screw.

7. The fixture of claim 1 wherein the
   circuit has a characteristic axis with an orientation relative to the carriage, and the carriage is mounted to the frame and includes adjustment means for changing the position of the probe card to correspond with the orientation of the characteristic axis of the circuit relative to the carriage.

8. The fixture of claim 7 wherein the carriage includes a generally flat carrier plate and a generally flat probe card plate, the probe card plate being movably mounted to the carrier plate and having clamp means for releasably mounting the probe card to the probe card plate.

9. A probe card fixture for moving a probe card relative to a circuit positioned adjacent thereto, wherein the circuit has a characteristic axis, the fixture comprising:
   a frame;
   a carriage mounted to the frame and adapted to carry a probe card, the carriage including a generally flat carrier plate having a center, a generally flat probe card plate movably mounted to the carrier plate and having a center and clamp means for releasably mounting the probe card to the probe card plate, adjustment means for changing the position of the probe card to correspond with the orientation of the characteristic axis of the circuit relative to the carriage, and mounting means for mounting the probe card plate to the carrier plate so that the centers thereof align in an axis, the mounting means being configured so that the probe card plate is selectively rotatable about the axis; and
   carriage drive means for reciprocally moving the carriage and probe card toward and away from the circuit.

10. The fixture of claim 9 including securing means for securing the probe card plate to the carrier plate while permitting rotation of the probe card plate.

11. The fixture of claim 8 wherein the clamp means includes a fixed surface and a movable surface for clamping the edge of a probe card therebetween, the clamp means configured so that the movable surface applies a clamping force to the probe card, the resultant of that force being directed through the fixed surface.

12. The fixture of claim 7 further including clamp means attached to the carriage for securing a probe card to the carriage whenever a probe card is positioned within a clamping space defined by the clamp means, the clamp means including catch means for preventing the probe card from dropping from the clamping space.

13. The fixture of claim 12 further including a handle attachable to a probe card and configured to abut the clamp assembly whenever the probe card is located at a particular location within the clamping space.

14. The fixture of claim 1 wherein the drive link is connected to the lead screw by an eccentric coupling and is driven in a reciprocating motion to rotate the lead screw in either rotational sense.

15. The fixture of claim 14 wherein the drive means further includes a motor operatively coupled to the drive link by an eccentric coupling for providing the reciprocating motion.

16. The fixture of claim 1 wherein the drive means is mounted on the frame.

17. A probe card fixture for moving a probe card toward and away from a circuit, comprising:
   a frame;
   a carriage adapted to hold a probe card;
   two or more lead screws mounted to the frame and connected to the carriage so that rotation of the lead screws in one of two opposing rotational senses moves the carriage in a corresponding one of two opposing directions;
   drive means controllable for selectively rotating the lead screws in either opposing sense, the drive means including a motor that provides rotational motion and a rigid drive link that interconnects the lead screws and the motor for delivering the rotational motion of the motor to the lead screws; and
   couplings for connecting each lead screw to the drive link, the couplings having a counterweight portion configured and arranged to balance the rotational forces applied to the lead screws.

18. The fixture of claim 17 wherein each coupling includes a post member, the drive link being rotatably mounted to the post member about an axis eccentric to the rotational axis of the lead screw.

19. A probe card fixture for moving a probe card toward and away from a circuit, comprising:
   a frame;
   a carriage adapted to hold a probe card;
   a lead screw mounted to the frame and connected to the carriage so that rotation of the lead screw in one of two opposing rotational senses moves the carriage in a corresponding one of two opposing directions; and
   drive means having a drive link operatively coupled to the lead screw for selectively rotating it in either opposing sense and for simultaneously constraining motion of the drive link to substantially a single plane.

20. The fixture of claim 19 wherein the drive link is substantially rigid, is coupled to the lead screw by an eccentric coupling, and is driven in a reciprocating motion to rotate the lead screw in either opposing sense.

21. The fixture of claim 20 further comprising a motor operatively coupled to the drive link by an eccentric coupling for providing the reciprocating motion.

22. The fixture of claim 18 wherein the drive means is mounted on the frame.

23. A fixture for moving a carriage relative to a frame, the carriage holding a probe card comprising:
   a lead screw mounted to the frame and connected to the carriage so that rotation of the lead screw in one of two opposing rotational senses moves the carriage in a corresponding one of two opposing directions; and
   drive means controllable for rotating the lead screws in either opposing sense and including a substantially rigid drive link that is connected to the lead screw by an eccentric coupling and is driven in a reciprocating motion to rotate the lead screw.

24. The fixture of claim 23 wherein the drive means is mounted on the frame.

25. The fixture of claim 23 wherein the drive means further includes a motor operatively coupled to the drive means by an eccentric coupling for providing the reciprocating motion.

* * * * *

UNITED STATES PATENT AND TRADEMARK OFFICE
CERTIFICATE OF CORRECTION

PATENT NO. : 4,935,694

DATED : June 19, 1990

INVENTOR(S) : Glenn E. Clarridge

It is certified that error appears in the above-identified patent and that said Letters Patent is hereby corrected as shown below:

Column 1, line 40, after "circuit" insert --.--.

Column 1, line 44, after "testing" insert --.--.

Column 6, line 22, change "10" to --110--.

Column 10, line 2, change "32" to --232--.

Column 11, line 48, after "300" delete --,--.

Col. 13, lines 51-65

Claim 1 should read as follows:

--A probe card fixture for moving a probe card toward and away from a circuit, comprising:

a frame;

a carriage adapted to hold a probe card;

a lead screw mounted to the frame and connected to the carriage so that rotation of the lead screw in one of two opposing rotational senses about a lengthwise lead screw axis moves the carriage in a corresponding one or two opposing directions along the lead screw axis; and drive means operatively coupled by a substantially rigid drive link to the lead screw for selective rotation of the lead screw in one of the opposing rotational senses about the lead screw axis to impart linear uniaxial motion to the carriage in the corresponding one of the two opposing directions along the lead screw axis.--.

UNITED STATES PATENT AND TRADEMARK OFFICE
CERTIFICATE OF CORRECTION

PATENT NO. : 4,935,694

DATED : June 19, 1990

INVENTOR(S) : Glenn E. Clarridge

It is certified that error appears in the above-identified patent and that said Letters Patent is hereby corrected as shown below:

Col. 15 & 16 lines 40-12

Claim 19 should read as follows:

--A probe card fixture for moving a probe card relative to a circuit, comprising:
    a frame;
    a carriage adapted to hold a probe card;
    a lead screw mounted to the frame and connected to the carriage so that rotation of the lead screw in one of two opposing rotational senses about a lengthwise screw axis moves the carriage in a corresponding one of two opposing directions along the lead screw axis; and
    drive means having a drive link operatively coupled to the lead screw for selectively rotating it in either opposing sense about the lead screw axis and for simultaneously constraining motion of the drive link to substantially a single plane.--.

UNITED STATES PATENT AND TRADEMARK OFFICE
CERTIFICATE OF CORRECTION

PATENT NO. : 4,935,694

DATED : June 19, 1990

INVENTOR(S) : Glenn E. Clarridge

It is certified that error appears in the above-identified patent and that said Letters Patent is hereby corrected as shown below:

Col. 16, lines 23-34

Claim 23 should read as follows:

--A fixture for moving a carriage relative to a frame, the carriage holding a probe card, comprising:
a lead screw mounted to the frame and connected to the carriage so that rotation of the lead screw in one of two opposing rotational senses about a lengthwise lead screw axis moves the carriage in a corresponding one of two opposing directions along the lead screw axis; and
drive means controllable for rotating the lead screws in either opposing sense about the lead screw axis and including a substantially rigid drive link that is connected to the lead screw by an eccentric coupling and is driven in a reciprocating motion to rotate the lead screw.--.

Signed and Sealed this

Thirty-first Day of March, 1992

Attest:

HARRY F. MANBECK, JR.

*Attesting Officer*     *Commissioner of Patents and Trademarks*